Figure 1:
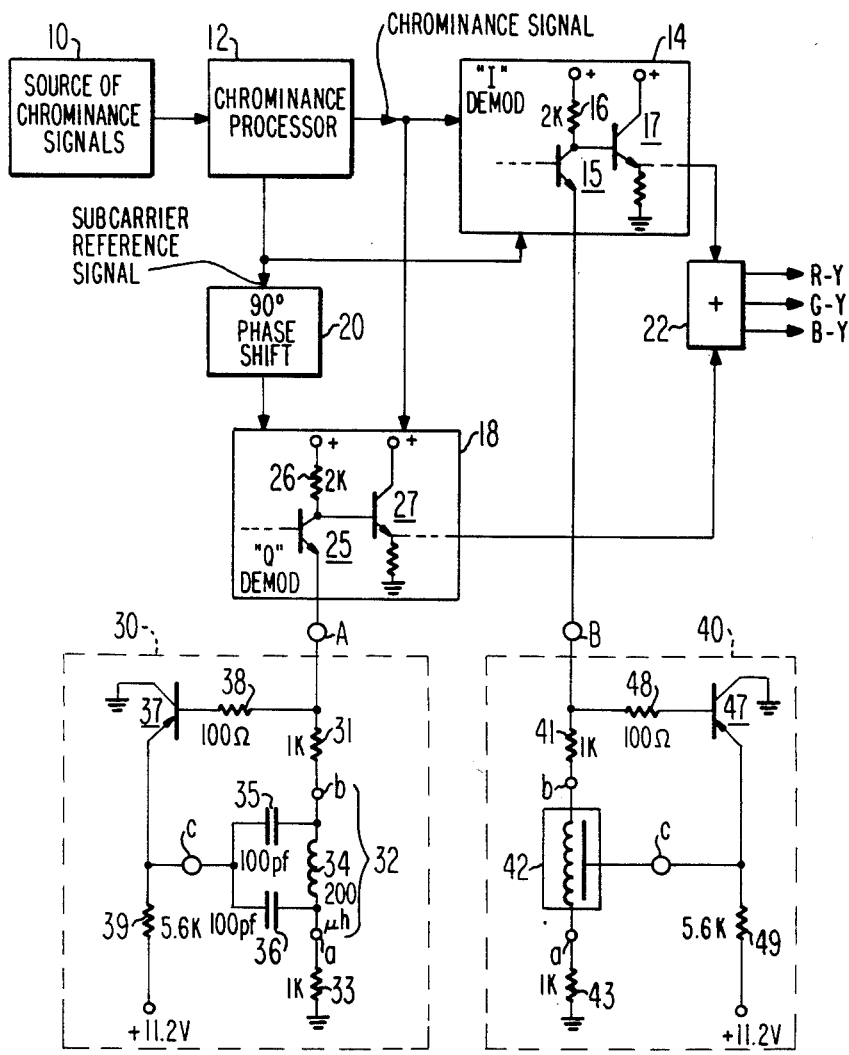

United States Patent [19]

Sepp

[11] Patent Number: 4,562,458
[45] Date of Patent: Dec. 31, 1985

[54] CIRCUIT FOR COUPLING A THREE TERMINAL FILTER TO A SIGNAL PATH USING ONE INTERFACE CONNECTION

[75] Inventor: Walter E. Sepp, Princeton, N.J.

[73] Assignee: RCA Corporation, Princeton, N.J.

[21] Appl. No.: 470,618

[22] Filed: Feb. 28, 1983

[51] Int. Cl.[4] .............................. H04N 9/535
[52] U.S. Cl. ................... 358/21 R; 307/520; 330/294; 330/303
[58] Field of Search ........... 358/21, 23, 24, 28; 333/167, 174, 175, 176; 307/520; 330/303, 294

[56] References Cited

U.S. PATENT DOCUMENTS

| | | | |
|---|---|---|---|
| 2,908,752 | 10/1959 | Lockhart | 358/23 |
| 3,595,989 | 7/1971 | Hoke | 358/23 |
| 3,864,641 | 2/1975 | Ahmed | 330/17 |
| 4,207,590 | 6/1980 | Naimpally et al. | 358/28 |

OTHER PUBLICATIONS

Oswald G. Villard et al., "Flexible Selectivity for Communications Receivers", Apr. 1952, Electronics, vol. 25, Issue 4, pp. 138-140.
Article "Economical RC Active Lossy Ladder Networks", by J. M. Rollett (Electronic Letters, Feb. 8, 1973, vol. 9, No. 3, pp. 70-72).

Primary Examiner—John W. Shepperd
Attorney, Agent, or Firm—P. J. Rasmussen; P. M. Emanuel; R. H. Kurdyla

[57] ABSTRACT

An electrical signal processing network includes a high order, two port, three terminal filter, and means coupled to the filter for synthesizing, at a single terminal, an impedance exhibiting the transfer function of the filter. The synthesized impedance can be coupled to a single point in a signal path for filtering signals in accordance with the transfer function of the filter.

29 Claims, 3 Drawing Figures

CIRCUIT FOR COUPLING A THREE TERMINAL FILTER TO A SIGNAL PATH USING ONE INTERFACE CONNECTION

This invention concerns an arrangement to facilitate the coupling of a high order filter to a signal path conveying an electrical signal to be filtered.

High order filter networks, such as including "π" or "T" type filter configurations comprising inductive and capacitive elements, are basically four terminal networks with a pair of input terminals associated with an input section of the filter, and a pair of output terminals associated with an output section of the filter. Such filters are referred to as two-port, three-terminal networks when one of the terminals of the input and output sections are connected in common. In such case the first terminal corresponds to an input port, and the second terminal corresponds to an output port. The third terminal is coupled to a point in the filter network intermediate to the first and second terminals via circuit elements which contribute to establishing the filter transfer function together with other circuit elements coupled between the first and second terminals. The input and output sections of the filter are usually terminated in appropriate terminating impedances determined with respect to signal processing circuits with which the filter is utilized.

In practice, such two-port, three-terminal reactive filter networks require at least two connections to a signal path conveying signals to be filtered. Thus when the signal path is constructed in an integrated circuit device, such filters must be connected to the signal path via two external terminals of the integrated circuit device. This is disadvantageous since an integrated circuit has only a limited number of terminals available for connection to external circuits.

Accordingly, in accordance with the principles of the present invention there are disclosed herein arrangements of high order filter networks of the three-terminal, two-port type which can be coupled to the signal path via a single connection to the signal path. The filter arrangements include means for synthesizing, at a single terminal, an impedance having a transfer function corresponding to the transfer function of the filter.

In accordance with one feature of the disclosed invention, a first filter signal port is connected to the signal path via a single interface terminal, and a second filter signal port is coupled to an operating potential. Signals derived from the signal path are applied both to the first filter port, and to a filter terminal intermediate to the first and second signal ports of the filter.

Figure 2:
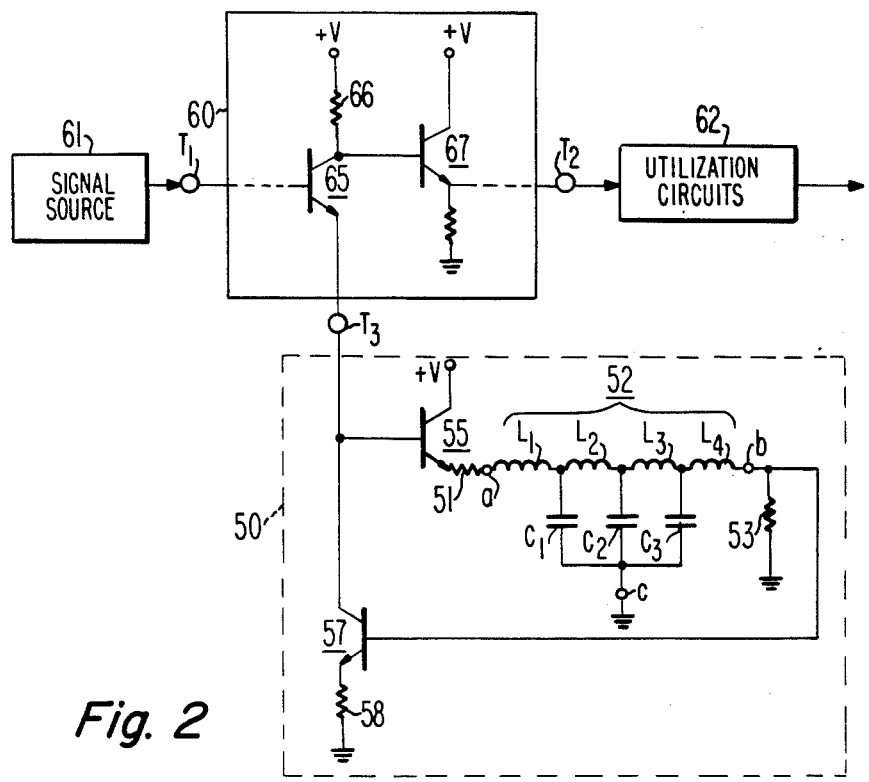
Figure 3:
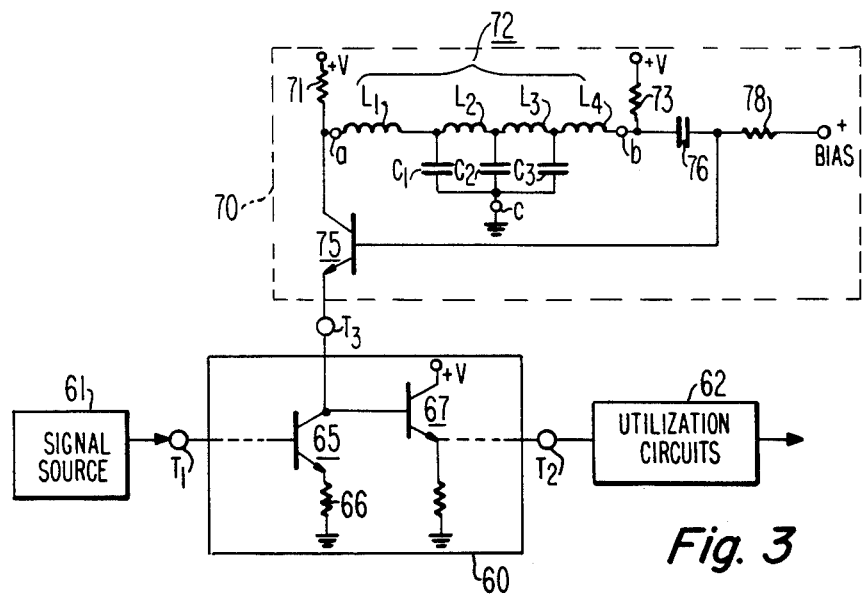

In the drawing:

FIG. 1 illustrates a portion of a color television receiver according to NTSC television broadcast signal standards, including filter arrangements according to the present invention; and FIGS. 2 and 3 depict alternative embodiments of filter arrangements according to the present invention.

In FIG. 1, chrominance information signals from a source 10 are applied to a chrominance signal processor 12, which includes chrominance gain control and phase control networks and various other signal processing circuits of a conventional nature, including a controlled local oscillator for regenerating a color subcarrier reference signal. Processed chrominance information signals from processor 12 are applied to information signal inputs of an "I" phase chrominance signal demodulator 14, and a "Q" phase chrominance signal demodulator 18. A regenerated chrominance subcarrier reference signal is applied from processor 12 to a reference signal input of demodulator 14, and a mutually quadrature phased subcarrier reference signal is applied to a reference signal input of demodulator 18 via a 90° phase shifting network 20. After appropriate filtering as will be discussed, demodulated I and Q chrominance signal components from the outputs of demodulators 14 and 18 are combined in a matrix amplifier 22 for developing output R-Y, G-Y and B-Y color difference signals. These signals are ultimately combined with the luminance component of the composite color television signal to produce red, green and blue color image representative signals for application to a color image display device.

The signal path within I demodulator 14 includes a phase detector (e.g., a synchronous demodulator) and an output circuit for receiving demodulated signals. The output circuit is shown as including an amplifier transistor 15 with an associated collector output load resistor 16, and an emitter follower transistor 17. Functionally corresponding transistors 25, 27 and a load resistor 26 are included in the signal path of Q demodulator 18 for receiving demodulated Q signals. The emitter electrodes of transistors 25 and 15 are respectively coupled via interfacing terminals A and B to synthesizing networks 30 and 40 according to the present invention, as will be discussed in detail subsequently. When I and Q demodulators 14 and 18 are constructed in an integrated circuit device, terminals A and B correspond to external connecting terminals of the integrated circuit device.

In a color television signal processing system according to NTSC broadcast standards such as employed in the United States, the Q signal modulation component occupies an approximately 0.5 MHz bandwidth on both upper and lower sidebands with respect to the approximately 3.58 MHz frequency of the chrominance subcarrier signal. The quadrature phased I signal modulation component occupies an approximately 1.5 MHz bandwidth on a lower sideband relative to the chrominance subcarrier frequency, and occupies a 0.5 MHz bandwidth on an upper sideband relative to the chrominance subcarrier frequency. Thus the Q chrominance information to be demodulated includes signal frequencies from 3.08 MHz to 4.08 MHz, and the I chrominance information to be demodulated includes signal frequencies from 2.08 MHz to 4.08 MHz.

Filtering of the demodulated I and Q signals is required to provide appropriate I and Q signal information to the inputs of matrix 22, and to eliminate unwanted signal frequencies such as harmonics of the 3.58 MHz chrominance subcarrier signal. Such filtering is performed in accordance with the transfer functions of filter networks respectively associated with synthesizing networks 30 and 40.

Network 30 includes a third order low pass filter 32 comprising inductor 34 and capacitors 35, 36 and exhibiting a zero MHz to 0.5 MHz amplitude vs. frequency response characteristic (transfer function) at the −3db points. The configuration of filter 32 is that of a filter having three terminals (a,b,c), and two ports (a,b) between which the filter transfer function is developed. Resistors 31 and 33 serve as terminating impedances for filter 32. Network 30 also includes a substantially unity voltage gain PNP emitter follower transistor 37 with a high impedance base signal input electrode coupled to terminal A via a resistor 38, and a low impedance emitter output electrode coupled to terminal c of filter 32. A bias resistor 39 determines the emitter bias current of transistor 37.

The arrangement of filter 32 with transistor 37 causes the collector current of amplifier transistor 25 to exhibit a transfer function H(s) corresponding to the transfer function H(s) of filter 32. Accordingly, an output signal voltage developed across collector load resistor 26, and the output signal from demodulator 18, exhibit the transfer function of filter 32.

More specifically, the signal voltage developed at the low impedance emitter of amplifier transistor 25 appears at terminal A and at the base input of voltage follower transistor 37. Transistor 37 exhibits a substantially unity signal voltage gain (e.g., approximately 0.98), and applies the signal voltage via the low impedance emitter of transistor 37 to intermediate terminal c of filter 32. In essence, transistor 37 acts as a second source of signal voltage for application to filter 32 via filter terminal c, the first source of signal voltage corresponding to the emitter of amplifier transistor 25 which is coupled to filter terminal b via terminal A and resistor 31.

It is noted that with this arrangement, signal voltages of similar phase and substantially equal magnitude are respectively applied to intermediate filter terminal c, and to resistor 31 which is connected to filter terminal b (i.e., a substantially zero signal voltage differential exists between filter terminal c and the point at which resistor 31 is connected to terminal A). Also, resistor 33 connects filter terminal "a" to a point of fixed potential (ground). Thus filter terminals b and c are modulated with input signal voltages whereas filter terminal "a" is not. As a result, the current conducted by resistor 33 varies in accordance with the input signal voltage but does not exhibit the transfer function of filter 32. However, the current conducted by resistor 31 exhibits the transfer function of filter 32. This current corresponds to the collector-emitter current of amplifier transistor 25, and causes load resistor 26 to exhibit a signal voltage having the transfer function of filter 32.

Network 30 achieves this result by synthesizing, at terminal A, an impedance which is related to (i.e., the reciprocal of) the transfer function of three-terminal filter 32. The signal current conducted by resistor 31, terminal A and the collector-emitter path of transistor 25 corresponds to the product of the input signal voltage at the emitter of transistor 25 and the transfer function of filter 32. In this regard it is noted that the emitter signal voltage of transistor 25 substantially corresponds to the base signal voltage of transistor 25, but the emitter signal current of transistor 25 exhibits the filter transfer function.

In this embodiment filter 32 provides a DC current path from the emitter of transistor 25 to ground, via terminating resistors 31, 33 and inductor 34 of filter network 32. If the filter network did not provide such DC path, a separate DC current source would be required for the emitter of transistor 25 (e.g., within network 18).

The format of filter 32 with transfer function H(s) is the same as the format of a filter that would otherwise be inserted in the signal path (i.e., via two connections to the signal path) to achieve transfer function H(s). Thus once the signal filtering transfer function is decided upon, a filter of conventional design can be utilized as described to implement such transfer function with respect to the signals to be filtered.

Emitter follower transistor 37 preferably exhibits a high input impedance presented to terminal b of filter 32 and a low output impedance presented to terminal c of filter 32 so as not to disturb the normally expected transfer function of filter 32. Transistor 37 preferably exhibits substantially unity voltage gain, although other voltage gains can be used. However, the transfer function imparted to the signal current conducted by resistor 31, terminal A and transistor 25 is identical to the filter transfer function when identical signal voltages are applied to resistor 31 and filter terminal c. Differences in the relative magnitudes of these signal voltages result in the current conducted by terminal A exhibiting a transfer function which deviates from the normally expected transfer function of the filter. Also, an excessively high voltage gain for transistor 37 increases the likelihood of network 30 oscillating. Resistor 38 serves to reduce the likelihood of circuit oscillation by suppressing the effects of parasitic capacitances associated with the base input of transistor 37.

The signal gain of the amplifier stage comprising transistor 25 is a function of the impedance exhibited by load resistor 26 and the impedance presented to the emitter of transistor 25 by network 30. The gain and biasing requirements of the amplifier stage are also related to the values of filter terminating resistors 31 and 33.

With some other types of filters it may not be necessary to employ two filter terminating resistors. For example, a resistor corresponding to resistor 31 may be deleted in certain cases. Signal voltages of equal magnitude would be applied directly to terminals b and c of such filters.

Synthesizing network 40 provides the high order filtering required for demodulated I signals processed by amplifier transistor 15 in the signal path of I demodulator 14. Network 40 includes a seventh order low pass filter designated by filter element 42, which exhibits a zero MHz to 1.5 MHz amplitude vs. frequency response characteristic (transfer function) at the −3db points. The configuration of filter 42 is that of a filter having three terminals (a,b,c) and two ports (a,b). Filter 42 may be provided in encapsulated form, and comprises a plurality of inductances and capacitances arranged in a configuration as will be seen subsequently in connection with element 52 of FIG. 2. Low pass filter 42 exhibits a −3 db point of 1.5 MHz, a −30 db point at approximately 3.58 MHz, and greater than 30 db attenuation at 7.2 MHz and beyond to significantly attenuate harmonics of the 3.58 MHz subcarrier frequency. Filter 42 also exhibits a relatively constant delay of about 390 nanoseconds to 1.5 MHz. Resistors 41 and 43 terminate filter 42, and a resistor 49 determines the emitter bias current for emitter follower transistor 47, which operates in the same manner as transistor 37 associated with network 30. A resistor 48 serves to reduce the likelihood of circuit oscillation.

Network 40 operates with respect to the signal path of demodulator 14 in the same manner as previously discussed network 30 operates with respect to demodulator 18, and also advantageously requires only a single connection to the signal processing path, via interface terminal B. Network 30 differs from network 40 in that a higher order filter 42 is employed.

Wide bandwidth (0–1.5 MHz) processing of the I chrominance signal component is particularly advantageous in high-definition color television signal processing systems, such as color receivers employing comb filtering techniques for extracting the luminance and chrominance components from the composite color television signal prior to luminance and chrominance processing. With wide bandwidth I demodulation, full advantage can be taken of the available color information content of the television signal, resulting in improved color image definition. The enhanced subjective color sharpness afforded by wideband I signal processing represents a significant improvement over narrowband (0-0.5 MHz) I signal processing, which is often utilized as an acceptable, less complex alternative. Difficulties associated with the requirement of high order filtering in a wideband chrominance demodulation system are reduced when filter arrangements according to the present invention are used, since such arrangements require only one connection to the signal processing path regardless of the order of filtering required. This results in a significant advantage when the demodulation circuits are constructed as an integrated circuit device with a limited number of available external connecting terminals.

FIG. 2 shows an alternative synthesizing network 50 including a seventh order low pass filter 52 of the three-terminal (a,b,c) two-port (a,b) type, comprising inductors $L_1$-$L_4$ and capacitors $C_1$-$C_3$. Resistors 51 and 53 serves as filter terminating impedances.

Network 50 is coupled via an interface terminal $T_3$ to the low impedance emitter of a signal amplifier transistor 65 included in the signal path of a signal processor 60. Signals amplified by transistor 65 are developed across a collector load resistor 66 and applied to an emitter follower coupling transistor 67. Input signals to be processed are supplied by a source 61 to an input terminal $T_1$ of processor 60, and output signals from processor 60 are coupled via an output terminal $T_2$ to utilization circuits 62.

In network 50, a substantially unity voltage gain emitter follower transistor 55 couples a signal voltage from the emitter of signal transistor 65 and terminal $T_3$ at a low output impedance to terminal "a" of filter 52 (an input port). Terminal b of filter 52 (an output port) provides a signal voltage in accordance with the amplitude vs. frequency response (transfer function) of filter 52. This voltage is applied to the base input of a current source transistor 57, which serves as a voltage-to-current converting device and develops a collector current exhibiting the filter 52 transfer function in response to the applied base voltage. Specifically, the collector current of transistor 57 corresponds to the product of the input signal voltage at the emitter of transistor 55, and the transfer function of filter 52. The collector current of current source transistor 57 determines the emitter and collector currents of amplifier transistor 65, whereby the signal voltage developed across load resistor 66 exhibits the transfer function of filter 52.

The high input impedance of follower transistor 55 essentially isolates the emitter of amplifier transistor 65 from the impedance of filter 52. Thus the emitter of transistor 65 is prevented from conducting a current in response to the impedance of filter 52. This assures that the current conducted by transistor 57, terminal $T_3$ and transistor 65 exhibits the low pass transfer characteristic of filter 52, substantially exclusive of signal components which would otherwise result in a current with a transfer function other than that of filter 52.

The signal gain of the amplifier comprising transistor 65 is determined by the ratio of the value of collector load impedance 66 to the value of emitter impedance represented by network 50. The impedance of network 50 decreases for signal frequencies within the passband of filter 52. Thus signal frequencies within the passband of filter 52 receive greater amplification by transistor 65, compared to out of band signal frequencies which cause network 50 to exhibit a relative greater impedance at the emitter of transistor 65.

The value of a bias resistor 58 determines the level of bias current conducted by current source transistor 57. Transistor 57 preferably should exhibit a low output parasitic capacitance.

FIG. 3 shows another filtering arrangement wherein a synthesizing network 70 is coupled directly to the collector output of amplifier transistor 65 via interface terminal $T_3$, rather than to the emitter of transistor 65 as in the case of the FIG. 2 arrangement. Network 70 includes a seventh order low pass filter 72 of the type disclosed in connection with FIG. 2. Resistors 71 and 73 serve as terminating impedances for filter 72.

The collector output of amplifier transistor 65 is coupled to network 70 via terminal $T_3$ and the low impedance emitter of a transistor 75, which has its collector-emitter current path coupled in series with the collector-emitter path of amplifier transistor 65 and resistor 71. A signal voltage developed across resistor 71 in response to the input signal applied to the base of transistor 65 (i.e., in response to the collector current of transistor 65) is translated by filter 72 to develop a signal voltage at filter terminal b exhibiting the filter transfer function. This voltage is AC coupled via a capacitor 76 to the base input of transistor 75, which acts as a substantially unity voltage gain voltage follower device with respect to its base voltage. The collector voltage of amplifier transistor 65 corresponds to the emitter voltage of transistor 75, which is substantially equal to its base voltage as derived from the output of filter 72. Thus the collector output voltage of amplifier transistor 65 exhibits the transfer function of filter 72. A biasing resistor 78 should be significantly larger than terminating resistor 73 so as not to present an excessive load to filter 72.

In this embodiment network 70 synthesizes, at terminal $T_3$, an impedance which exhibits the transfer function of filter 72. The emitter voltage of transistor 75 and thereby the collector voltage of transistor 65 correspond to the product of the signal current conducted by transistor 65 and the transfer function of filter 72. The collector signal current of amplifier transistor 65 is directly related to the base signal input of transistor 65, but the collector signal voltage of transistor 65 exhibits the transfer function of filter 72. In this regard transistor 75 comprises a current-to-voltage translator for developing a voltage in accordance with the filter transfer function in response to signal current conducted by transistor 65.

The low emitter input impedance of transistor 75 substantially prevents signal voltages from being developed at the collector of amplifier transistor 65 in direct response to the collector signal current of transistor 65. Thus the collector of transistor 65 receives as a signal voltage only the signal voltage produced at the emitter of transistor 75, which exhibits the transfer function of filter 72. This assures that the voltage at the emitter of transistor 75 and at the collector of transistor 65 exhibit the low pass transfer characteristic of filter 72, substantially exclusive of signal components which would otherwise result in a voltage with a transfer characteristic other than that of filter 72.

The signal gain of the amplifier comprising transistor 65 is determined by the ratio of the value of the collector load impedance comprising network 70 to the value of emitter resistor 66. The impedance of network 70 increases for signal frequencies within the passband of filter 72. Thus signal frequencies within the passband of filter 72 receive greater amplification compared to out of band signal frequencies which cause network 70 to exhibit a relatively smaller impedance at the collector of transistor 65. In the latter case for example, for a given level of signal current conducted by transistor 65, the output voltage from terminal b of filter 72 will diminish for high frequency signals above the pass band of low pass filter 72. This results in a corresponding reduction in the base and emitter voltages of transistor 75. A correspondingly reduced impedance is presented to the collector of transistor 65 since such collector impedance is a function of the ratio of (reduced) collector signal voltage to collector signal current.

Although the disclosed arrangements according to the principles of the present invention have been described with respect to high order low pass filters, it will be appreciated that the principles of the present invention can be utilized with respect to high pass and bandpass filters as well.

What is claimed is:

1. In combination with a signal processing system including a signal coupling path, apparatus comprising:
    an electrical signal filter of the type comprising two signal ports and three terminals and exhibiting a transfer function, determined by the structure of said filter, between said signal ports; and
    means for coupling said filter to said signal path via a single interface terminal, to effect filtering of signals conveyed by said signal path with said transfer function of said filter.

2. In combination with a signal processing system including a signal coupling path, apparatus comprising:
    an electrical signal filter of the type comprising two signal ports and three terminals and exhibiting a transfer function, determined by the structure of said filter, between said signal ports;
    means coupled to said filter for synthesizing, at a single interface terminal, an impedance related to the transfer function of said filter; and wherein
    said synthesizing means is coupled to said signal path via said single interface terminal, to effect filtering of signals conveyed by said signal path with said transfer function of said filter.

3. Apparatus according to claim 2, wherein
    said filter comprises a first terminal associated with one of said signal ports coupled to said signal path via said interface terminal, a second terminal associated with another of said signal ports coupled to an operating potential, and a third terminal situated intermediate to said first and second terminals; and
    said synthesizing means comprises signal coupling means for applying signals derived from said signal path to said filter via said third filter terminal.

4. In combination with a signal processing system including a signal coupling path, apparatus comprising:
    an electrical signal filter of the type comprising two signal ports and three terminals and having an associated transfer function, said filter comprising a first terminal coupled to said signal path via said interface terminal, a second terminal coupled to an operating potential, and a third terminal; and
    means coupled to said filter for synthesizing, at a single interface terminal, an impedance related to the transfer function of said filter, said synthesizing means being coupled to said signal path via said single interface terminal to effect filtering of signals conveyed by said signal path with the transfer function of said filter, said synthesizing means comprising signal coupling means for applying signals derived from said signal path to said third filter terminal; wherein
    said signal coupling means comprises an active device with a high impedance input terminal coupled to said signal path via said interface terminal and to said first filter terminal, and a low impedance output terminal coupled to said third filter terminal.

5. Apparatus according to claim 4, wherein
    said interface terminal is coupled to a low impedance point in said signal path.

6. Apparatus according to claim 4, wherein
    said signal path comprises an amplifier device with an input first terminal for receiving signals to be filtered, a low impedance second terminal, and a third terminal coupled to an output impedance, said second and third terminals defining a main current conduction path of said amplifier device; and
    said input terminal of said active coupling device is coupled to said low impedance terminal of said amplifier device via said interface terminal.

7. Apparatus according to claim 6, wherein
    said amplifier device corresponds to a transistor with base, emitter and collector electrodes respectively corresponding to said first, second and third terminals of said amplifier device; and
    said active coupling device corresponds to an emitter follower transistor with a base input terminal coupled to said first filter terminal and to said interface terminal, and an emitter output terminal coupled to said third filter terminal.

8. In combination with a signal processing system including a signal coupling path, apparatus comprising:
    an electrical signal filter of the type comprising two signal ports and three terminals and having an associated transfer function, said filter comprising a first terminal corresponding to a first signal port, a second terminal corresponding to a second signal port, and a third terminal intermediate to said first and second terminals coupled to an operating potential; said filter exhibiting said filter transfer function between said first and second signal ports; and
    means coupled to said filter for synthesizing, at a single interface terminal, an impedance related to the transfer function of said filter; said synthesizing means being coupled to said signal path via said single interface terminal to effect filtering of signals conveyed by said signal path with the transfer function of said filter; wherein said synthesizing means comprises
    buffer means for coupling signals derived from said signal path to said first filter port; and
    translating means responsive to signals from said second filter output port for conducting to said interface terminal a current exhibiting said filter transfer function.

9. Apparatus according to claim 8, wherein said buffer means comprises an active device with a high impedance input terminal coupled to said signal path via said interface terminal, and a low impedance output terminal coupled to said first filter port; and said translating means comprises voltage to current translating means.

10. Apparatus according to claim 9, wherein
said interface terminal is coupled to a low impedance point in said signal path.

11. Apparatus according to claim 10, wherein
said signal path comprises an amplifier device with an input first terminal for receiving signals to be filtered, a low impedance second terminal, and a third terminal coupled to an output impedance, said second and third terminals defining a main current conduction path of said amplifier device;

said input terminal of said active buffer device is coupled to said low impedance terminal of said amplifier device via said interface terminal; and current from said voltage to current translating means is conducted to said main current conduction path of said amplifier device via said interface terminal.

12. Apparatus according to claim 11, wherein
said amplifier device corresponds to a transistor with base, emitter and collector electrodes respectively corresponding to said first, second and third terminals of said amplifier device;

said active buffer device corresponds to an emitter follower transistor with a base input electrode coupled to said interface terminal, and an emitter output electrode coupled to said first filter port; and said voltage to current translating means comprises a transistor with an input electrode coupled to said second filter port, and a main current conduction path coupled to the main current conduction path of said amplifier transistor via said interface terminal.

13. In combination with a signal processing system including a signal coupling path, apparatus comprising:

an electrical signal filter of the type comprising two signal ports and three terminals and having an associated transfer function, said filter comprising a first terminal corresponding to a first signal port, a second terminal corresponding to a second signal port, and a third terminal intermediate to said first and second terminals and coupled to an operating potential, said filter exhibiting said transfer function between said first and second signal ports; and means coupled to said filter for synthesizing, at a single interface terminal, an impedance related to the transfer function of said filter; said synthesizing means being coupled to said signal path via said single interface terminal, to effect filtering of signals conveyed by said signal path with the transfer function of said filter; wherein said synthesizing means comprises coupling means coupled to said signal path via said interface terminal and to said first filter port for applying to said first port a voltage related to signals to be filtered; said coupling means being responsive to signals from said second filter port for developing, at said interface terminal, a signal voltage exhibiting said filter transfer function.

14. Apparatus according to claim 13, wherein
said synthesizing means comprises an active coupling device with a low impedance first terminal coupled to said signal path via said interface terminal, a second terminal coupled to said first filter port and to an impedance and with said first terminal defining a main current conduction path of said active device, and a control terminal coupled to said second filter port, said active device being responsive to said signals applied from said second filter port to said control terminal for producing at said low impedance first terminal a signal voltage exhibiting said filter transfer function.

15. Apparatus according to claim 14, wherein
said active device comprises a transistor with an emitter electrode corresponding to said low impedance first terminal, a collector electrode corresponding to said second terminal, and a base electrode corresponding to said control terminal; and said signal path comprises an amplifier device with an input first terminal for receiving signals to be filtered, a second terminal coupled to an operating potential, and an output third terminal coupled via said interface terminal to said emitter electrode of said active transistor device.

16. Apparatus according to claim 15, wherein
said first, second and third terminals of said amplifier device respectively correspond to base, emitter and collector electrodes.

17. In a signal processing system including a signal path for conveying electrical signals to be filtered, an electrical signal filtering network comprising:

an electrical signal filter of the type comprising a first terminal corresponding to a first signal port, a second terminal different from said first terminal and corresponding to a second signal port, and a third terminal intermediate to said first and second terminals; said filter exhibiting a transfer function between said first and second terminals;

first means for coupling electrical signals to be filtered from said signal path to said first filter terminal;

second means for coupling said second filter terminal to a reference potential; and third means for coupling said electrical signals to be filtered from said signal path to said intermediate third terminal; wherein said filter is excited via said first and third terminals with said electrical signals to be filtered, and said electrical signal filter effects a filtering of said signals conveyed by said signal path with said transfer function.

18. A network according to claim 17, wherein
said first and third coupling means respectively include separate signal sources for separately exciting said first and third filter terminals.

19. A network according to claim 17, wherein
said first coupling means includes a resistance for coupling electrical signals from said signal path to first filter terminal; and electrical signals applied to said resistance and to said third filter terminal exhibit similar phase and substantially equal magnitude.

20. A network according to claim 19, wherein
said first and third coupling means provide electrical signal voltages to said first and third filter terminals.

21. A network according to claim 20, wherein
said second coupling means comprises a resistance.

22. A network according to claim 17, wherein said filtering network is coupled to said signal path via a single interface terminal.

23. A network according to claim 17, wherein
said signal path comprises an amplifier device with an input first terminal for receiving signals to be filtered, and second and third terminals defining a main current conduction path of said amplifier device;
a load impedance is coupled to said third terminal of said active device;
an interface terminal is coupled to said second terminal of said active device; and
said first and third coupling means are coupled to said interface terminal.

24. A network according to claim 23, wherein
said interface terminal receives signals at a low impedance from said second terminal of said amplifier device; and
said third coupling means comprises an active device with a signal input coupled to said interface terminal, and a low impedance signal output coupled to said third filter terminal.

25. A network according to claim 24, wherein
a resistance is coupled from said interface terminal to said first filter terminal; and
signals applied to said resistance and to said third filter terminal exhibit similar phase and substantially equal magnitude.

26. In combination with a signal processing system, apparatus comprising:
an amplifier having an input first terminal, a low impedance second terminal, and an output third terminal coupled to a load impedance, said second and third terminals defining a main current conduction path of said amplifier;
an interface terminal coupled to said low impedance second amplifier terminal;
an electrical signal filter of the type comprising first and second signal ports and an associated transfer function; and
means for synthesizing, at said interface terminal, an impedance related to the transfer function of said filter, comprising
an active device with a first control electrode and second and third electrodes defining a main current conduction path of said active device, said main current path of said active device being coupled to said main current path of said amplifier via said interface terminal;
buffer means for coupling signals from said low impedance second electrode of said amplifier via said interface terminal to said first filter port; and
means for coupling signals exhibiting said filter transfer function from said second filter port to said control electrode of said active device for causing said active device to conduct to said amplifier via said interface terminal a signal current exhibiting said filter transfer function;
wherein the signal gain of said amplifier is a function of the ratio of said load impedance to said synthesized impedance.

27. In combination with a signal processing system, apparatus comprising:
an amplifier having an input first terminal, a low impedance second terminal coupled to an operating potential, and an output third terminal, said second and third terminals defining a main current conduction path of said amplifier;
an interface terminal coupled to said third terminal of said amplifier;
an electrical signal filter of the type comprising first and second signal ports and an associated transfer function; and
means for synthesizing, at said interface terminal, an impedance exhibiting the transfer function of said filter, comprising
an active device with a first control electrode, a low impedance second electrode coupled via said interface terminal to said main current path of said amplifier, and a third electrode coupled to a resistance, said second and third electrodes of said active device defining a main current path of said active device;
means for coupling said third electrode of said active device to said first filter port; and
means for coupling signals exhibiting said filter transfer function from said second filter port to said control electrode of said active device, for causing said active device to exhibit at said low impedance second electrode and thereby at said interface terminal a signal voltage exhibiting said filter transfer function;
wherein the signal gain of said amplifier is a function of the ratio of said synthesized impedance to said resistance.

28. In combination with a system for processing a color video signal including a chrominance component modulated with color image information, apparatus comprising:
means, including a signal coupling path, for demodulating said chrominance component;
an electrical signal filter of the type comprising two signal ports and three terminals and exhibiting a transfer function between said signal ports;
means coupled to said filter for synthesizing, at a single interface terminal, an impedance related to the transfer function of said filter; and wherein
said synthesizing means is coupled via said single interface terminal to said signal path for causing signals conveyed by said signal path to be filtered in accordance with said filter transfer function.

29. Apparatus according to claim 28, wherein
said demodulating means is constructed as an integrated circuit; and
said interface terminal corresponds to a single external terminal of said integrated circuit.

* * * * *